US006546537B1

(12) United States Patent
Komoda

(10) Patent No.: US 6,546,537 B1
(45) Date of Patent: Apr. 8, 2003

(54) WIRING DATA GENERATION METHOD AND WIRING DATA GENERATION APPARATUS ALLOWING INCONSISTENCY BETWEEN BLOCK INTERNAL LINE AND BLOCK EXTERNAL LINES

(75) Inventor: Michio Komoda, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/497,172

(22) Filed: Feb. 3, 2000

(30) Foreign Application Priority Data

Aug. 4, 1999 (JP) .......................................... 11-221103

(51) Int. Cl.[7] .............................................. G06F 17/50
(52) U.S. Cl. ........................................ 716/12; 257/208
(58) Field of Search ........................... 716/7–9, 12–14, 716/2, 4; 257/208

(56) References Cited

U.S. PATENT DOCUMENTS 5,883,808 A * 3/1999 Kawarabayashi ............... 716/2
6,289,495 B1 * 9/2001 Raspopovic et al. ........... 716/12
6,339,235 B1 * 1/2002 Takata ........................ 257/208

FOREIGN PATENT DOCUMENTS

JP              8-330523         12/1996

* cited by examiner

Primary Examiner—Matthew Smith
Assistant Examiner—Thuan Do
(74) Attorney, Agent, or Firm—McDermott, Will & Emery

(57) ABSTRACT

A wiring data generation method includes the steps of generating a line in a block of a first level, carrying out layout of the block of the first level in a block of a second level higher than the first level, and generating mesh lines of the block of the second level connected to the line in the block of the first level within the block of the second level.

22 Claims, 12 Drawing Sheets

WIRING DATA GENERATION METHOD AND WIRING DATA GENERATION APPARATUS ALLOWING INCONSISTENCY BETWEEN BLOCK INTERNAL LINE AND BLOCK EXTERNAL LINES

BACKGROUND OF THE INVENTION

1. Field of the Invention

The present invention relates to a wiring data generation method such as of a clock line layout in a hierarchical layout, and particularly to a wiring data generation method that allows flexible block arrangement adjustment at the LSI (Large Scale Integrated circuit) level, and an apparatus therefor.

2. Description of the Background Art

It is difficult to properly supply a clock simultaneously to all the sequential elements in an LSI. Time difference occurs among the clocks supplied to each unit. This time difference is called "clock skew". Particularly as the LSI is increased in integration density and the circuit scale becomes larger, the clock skew to the units in the LSI must be suppressed as low as possible. How the clock skew is reduced is of great concern. Since the clock skew is generated mainly at the design stage, skew control of high accuracy is required in configuring the clock.

A conventional skew control method is described hereinafter with reference to FIGS. 1A and 1B. A clock signal supplied to an LSI 221 from an input CLK of LSI 221 passes through a clock buffer 102 provided in LSI 221 and applied to a prebuffer 103. Prebuffer 103 distributes this clock signal to clock lines 221 arranged in a mesh all over LSI 221. A plurality of clock drivers 227 are prepared on, for example, cross points of clock mesh 224. Clock drivers 227 have their outputs short-circuited with each other. In other words, there are mesh of an input line 225 and an output line 226 of the driver as shown in FIG. 1B. The clock from output line 226 is supplied to a sequential element 228.

In practice, sequential element 228 is arranged and routed after mesh-like clock lines 224 are prepared in an LSI. However, it is extremely rare to distribute sequential elements 228 uniformly within LSI 221. Sequential elements 228 are often located in disproportion within a particular mesh cell. As a result, the skew increases.

An attempt has been made to reduce the skew by adjusting the driving capability of clock driver 227 and the like on the basis of the arrangement result of the sequential elements in the entire LSI 221. It is therefore general to place clock driver 227 at a region in clock line 224 prepared therefor. This provides the advantage that the driving capability of clock driver 227 can be adjusted without having to correct the other arrangement and routing results.

In this method, the output of clock driver 227 is short-circuited. If a driver of a large delay and a driver of a small delay are present, there will be a feedback system in which a signal is output from a fast driver to a slow driver. Skew adjustment is also carried out by optimizing the driver from the eventual arrangement of the sequential elements in the LSI itself. Thus, high skew accuracy is achieved by this method.

The so-called hierarchical layout is required when the LSI complexity increases. The hierarchical layout is a method introduced to implement the LSI layout efficiently. In the hierarchical layout method, the LSI is divided into several blocks. First, layout is carried out on a block basis. Then the block having the layout completed is arranged and routed optimally, followed by the layout of the entire LSI. There is also the case where a hierarchy that has the layout already completed in another LSI is reused. Hierarchical layout is required also in this case.

The clock configuration method in the hierarchical layout of a conventional LSI 241 will be described here with reference to FIG. 2. First, the layout of hierarchies 249a–249d is carried out. Therefore, clocks 250a–250d are first configured. The clock in each of hierarchies 249a–249d can be configured in advance according to a method as shown in FIGS. 1A and 1B. Alternatively, a driver of a tree structure as shown in hierarchy 249a of FIG. 2 can be used.

When the layout of each hierarchy has been entirely completed, the entire layout of LSI 241 is carried out using the block layout. As to the clock configuration, the clock input of each block is connected to the signal that passes through clock buffer 102. At the clock input connection, a delay element, for example, is inserted so as to conform to the delay of the slowest clock driver, in addition to driver 251a that distributes the clock in order to compensate for the delay of clocks 250a–250d to supply a clock at a low skew to all the sequential elements driven by clock signal CLK. In the example shown in FIG. 2, delay elements 252a–252c are inserted supposing that clock driver 251d is the slowest clock driver.

In the case where the hierarchical layout is effected as described above, there are the following three types of skews.

(1) Skew of the clock configured in each block;
(2) Skew caused by clock distribution to each block from clock CLK;
(3) Skew based on a delay element to compensate for clock delay.

It is therefore extremely difficult to essentially reduce the skew since there are three causes of the skew.

According to the method configuring the clock by the entire LSI, the skew is small since there is only the skew of the configured clock. If hierarchical layout is to be effected using this method, there is the restriction in that the block can be arranged only at the position where the clock line in the block and the clock line of the LSI match due to the presence of the mesh-like clock wiring arranged all over the LSI. Therefore, layout according to this method is not easy.

Consider, for example, a case where the layout of a block is completed, and a block adjacent thereto is larger than the expected size. In order to provide a region to arrange this large block, the previous block that has the layout completed may have to be shifted from the originally planned arrangement position. However, the block can be shifted only in the unit of the mesh cell since the mesh clock lines arranged over all the LSI cannot be moved. As a result, optimum arrangement adjustment of each block at the LSI level cannot be carried out. There is a problem that the advantage of the hierarchical layout is lost.

SUMMARY OF THE INVENTION

In view of the foregoing, an object of the present invention is to provide a wiring data generation method and apparatus configuring a low skew clock corresponding to hierarchical layout.

Another object of the present invention is to provide a wiring data generation method and apparatus configuring a low skew clock that can adjust the arrangement of each block more flexibly corresponding to hierarchical layout.

A further object of the present invention is to provide a wiring data generation method and apparatus that can realize arrangement and routing corresponding to the design requirement while sufficiently making the most of previous property.

According to an aspect of the present invention, a wiring data generation method generating wiring data in designing a large-scale integrated circuit by hierarchical layout includes the steps of: generating a line in a block of a first level; carrying out layout of the block of the first level within a block of a second level higher than the first level; and generating mesh lines of the block of the second level connected to the line in the block of the first level within the block of the second level.

Since the line in the block of the first level and the mesh lines in the block of the second level are provided individually, there is no possibility of the lines at the second level being modified greatly even when the block of the first level is moved. Also, the skew occurring in the signal transmitted to the first block is small since mesh lines are formed in the block of the second level.

Preferably, the step of generating a line in the block of the first level includes the steps of generating a line surrounding the outermost perimeter of the block of the first level, and generating mesh lines of the block of the first level connected to the line surrounding the outermost perimeter within the line surrounding the outermost perimeter of the block of the first level.

The line formed at the outermost perimeter of the block of the first level can be connected to any of the mesh lines in the block of the first level. The same signal can be supplied to all the mesh lines in the block of the first level independent of the connected location with the mesh lines in the block of the second level.

Further preferably, the step of generating mesh lines in the block of the second level includes the step of forming mesh lines of the second level at a region of the block of the second level outside the region of the block of the first level, and connecting the mesh lines of the second level to the line surrounding the outermost perimeter.

The line surrounding the outermost perimeter of the block of the first level can be easily connected to all the mesh lines of the block of the second level that crosses a region of that block. The mesh lines of the second level can easily be connected to the line in the block of the first level even when the block of the first level is moved.

According to another aspect of the present invention, a wiring data generation apparatus generating wiring data in designing a large-scale integrated circuit by hierarchical layout includes: means for generating a line in a block of a first level; means for carrying out layout of the block of the first level in a block of a second level higher than the first level; and means for generating mesh lines of the block of the second level connected to the line in the block of the first level in the block of the second level.

There is no possibility of the line at the second level being greatly modified even when the block of the first level is moved since the line in the block of the first level and the mesh lines in the block of the second level are arranged individually. Also, the skew generated in the signal transmitted to the first block is small since mesh lines are formed in the block of the second level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
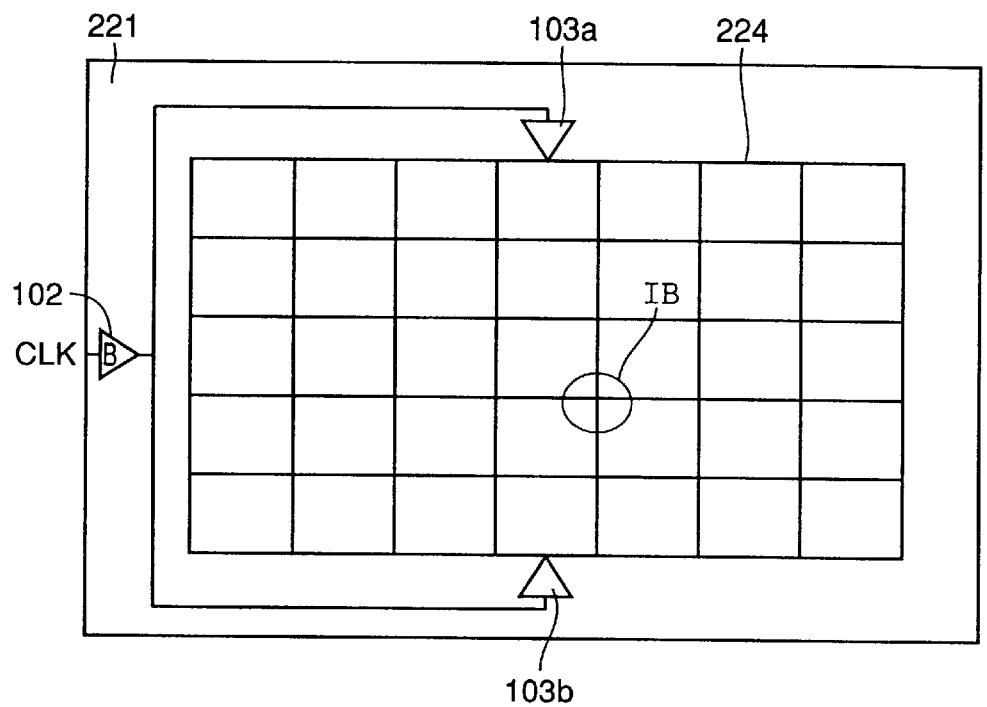
FIGS. 1A and 1B are plan views of an LSI indicating a clock configuration method of conventional art.
Figure 1B:
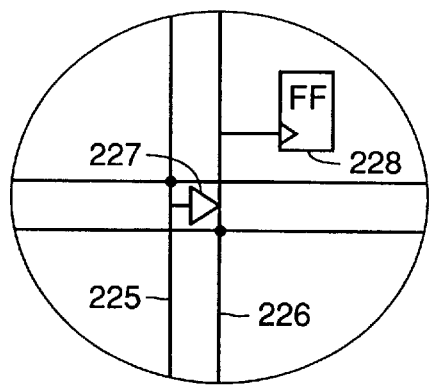
Figure 2:
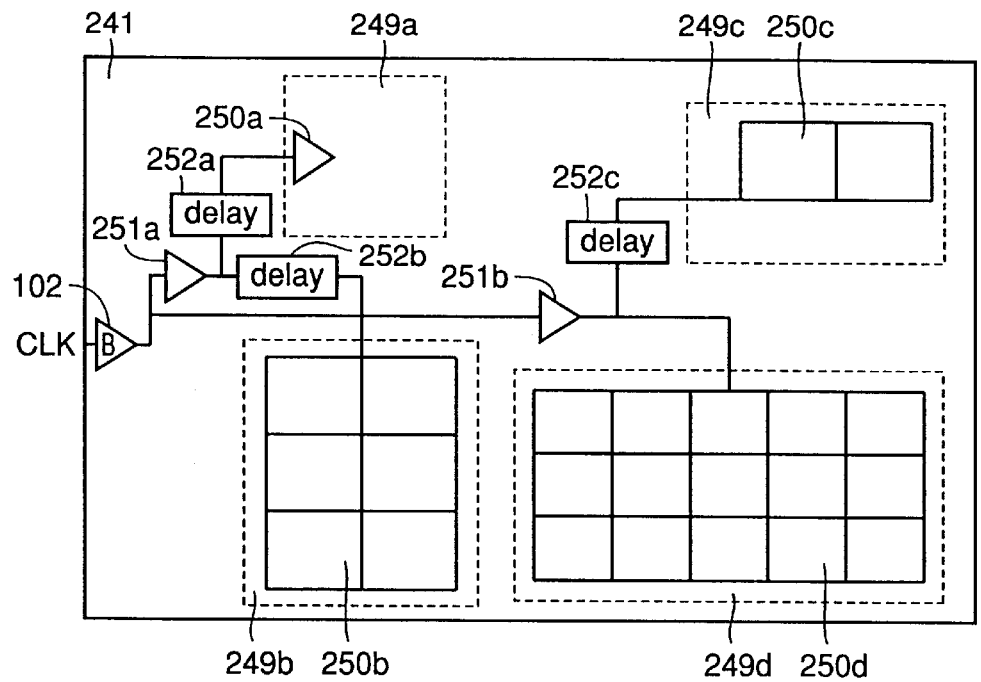
FIG. 2 is a plan view of an LSI showing one method of reducing a clock skew in conventional art.
Figure 3:
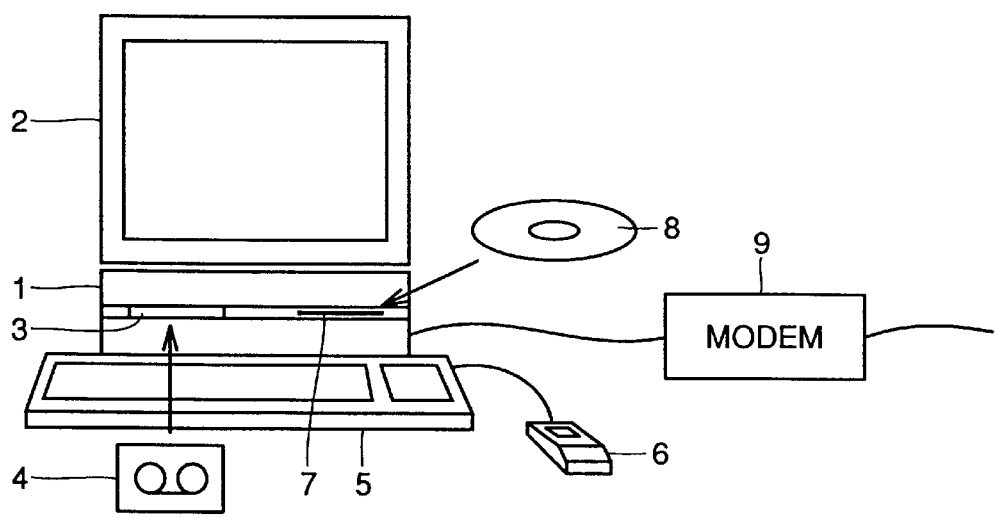
FIG. 3 shows an appearance of an apparatus of an embodiment of the present invention.

Referring to FIG. 3, a wiling data generation apparatus according to a first embodiment of the present invention includes a computer unit 1, a graphic display device 2, a magnetic tape device 3 in which a magnetic tape 4 is mounted, a keyboard 5, a mouse 6, a CD-ROM device 7 in which a CD-ROM (Compact Disk-Read Only Memory) 8 is mounted, and a communication modem 9. A wiring data generation program to realize the method that will be described in the following is supplied by a storage medium such as magnetic tape 4 or CD-ROM 8. The wiling data generation program is executed by computer unit 1. The operator generates wiring data by manipulating keyboard 5 or mouse 6 while viewing graphic display device 2. The wiring data generation program and other data can be supplied via communication modem 9 to computer unit 1 through a communication line.

Figure 4:
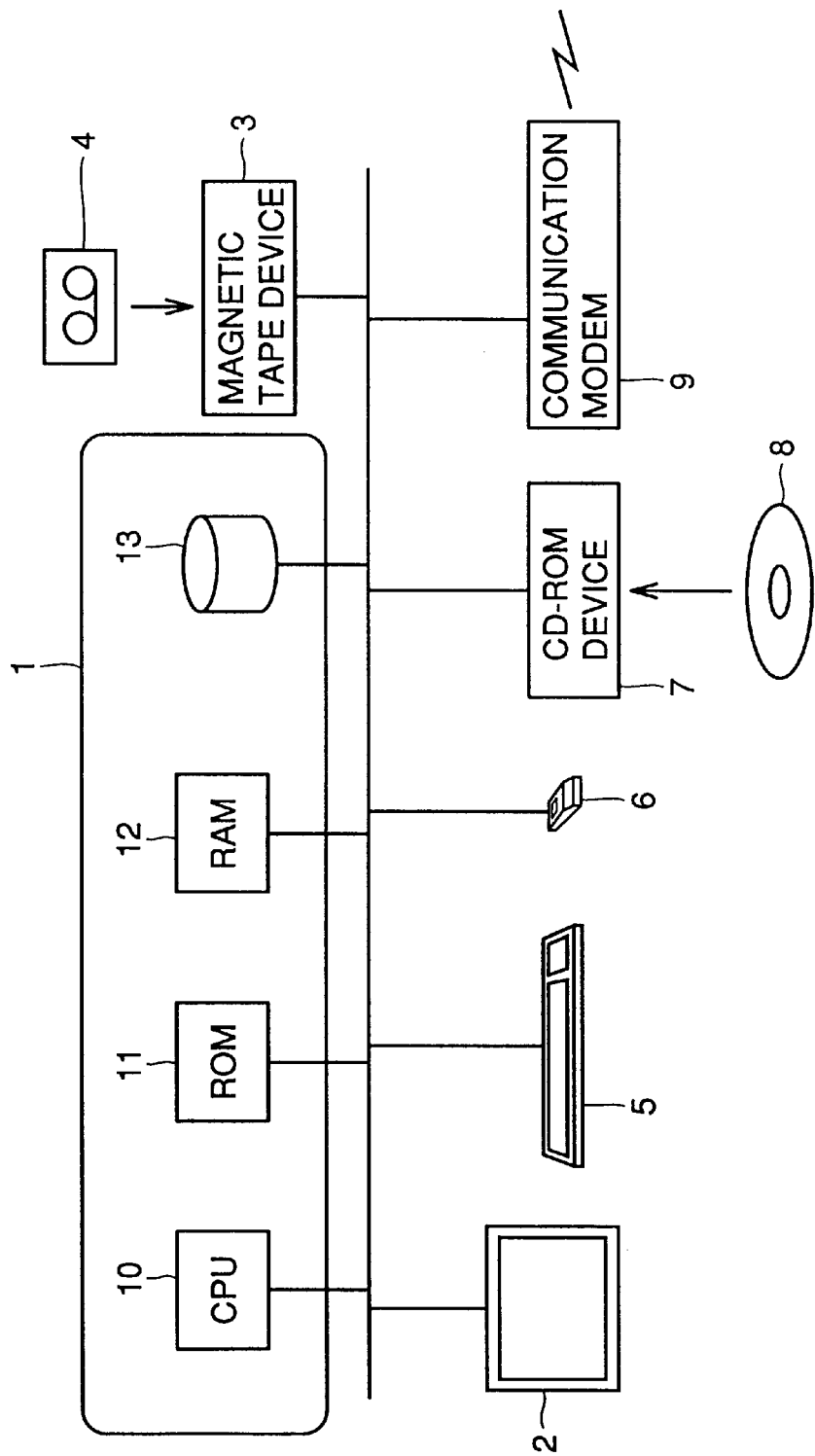
FIG. 4 is a hardware block diagram of an apparatus of an embodiment of the present invention.

FIG. 4 is a block diagram showing an example of the structure of the wiring data generation apparatus of the present invention. Computer unit 1 of FIG. 3 includes a CPU (Central Processing Unit) 10, a ROM (Read Only Memory) 11, a RAM (Random Access Memory) 12, and a hard disk 13. CPU 10 executes a process while transferring/receiving data to/from graphic display device 2, magnetic disk device 3, keyboard 5, mouse 6, CD-ROM device 7, communication modem 9, ROM 11, RAM 12 or hard disk 13. The wiring data generation program and other data stored in magnetic tape 4 or CD-ROM 8 are stored in hard disk 13 by CPU 10 via magnetic tape device 3 or CD-ROM device 7. CPU 10 loads the wiring data generation program having a structure that will be described appropriately hereinafter from hard disk 13 to RAM 12 to generate LSI wiling data using a clock skew configuration method reduced in clock skew.

The appearance of the apparatus and the block configuration of subsequent second–sixth embodiments are similar to those of the present first embodiment. Therefore, detailed description of the hardware configuration will not be repeated in the second–sixth embodiments.

Figure 5:
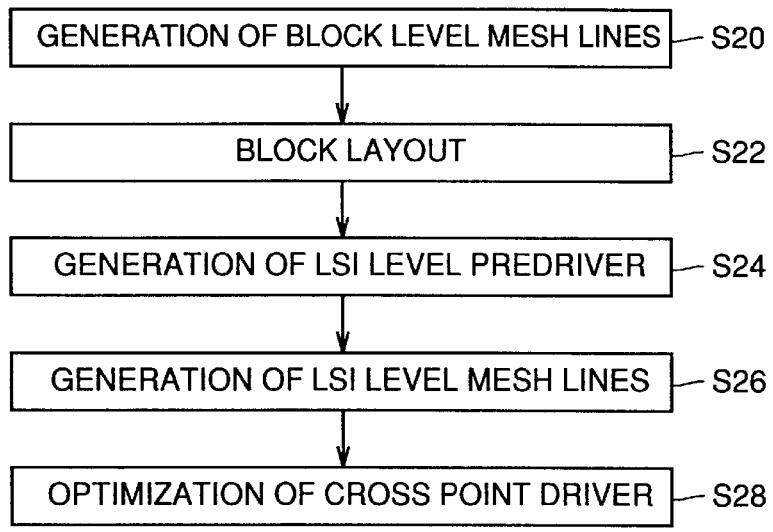
FIG. 5 is a flow chart representing the process flow of an apparatus according to a first embodiment of the present invention.

Referring to FIG. 5, the clock configuration method of the first embodiment includes the steps of: preparing mesh clock lines in the unit of blocks (S20), carrying out hierarchical layout (block layout) (S22), carrying out layout at the LSI level and generating an LSI level prediiver (S24), generating a clock line at the LSI level (S26), and optimizing a cross point driver (S28). The contents of the process of each step will be described hereinafter.

Figure 6:
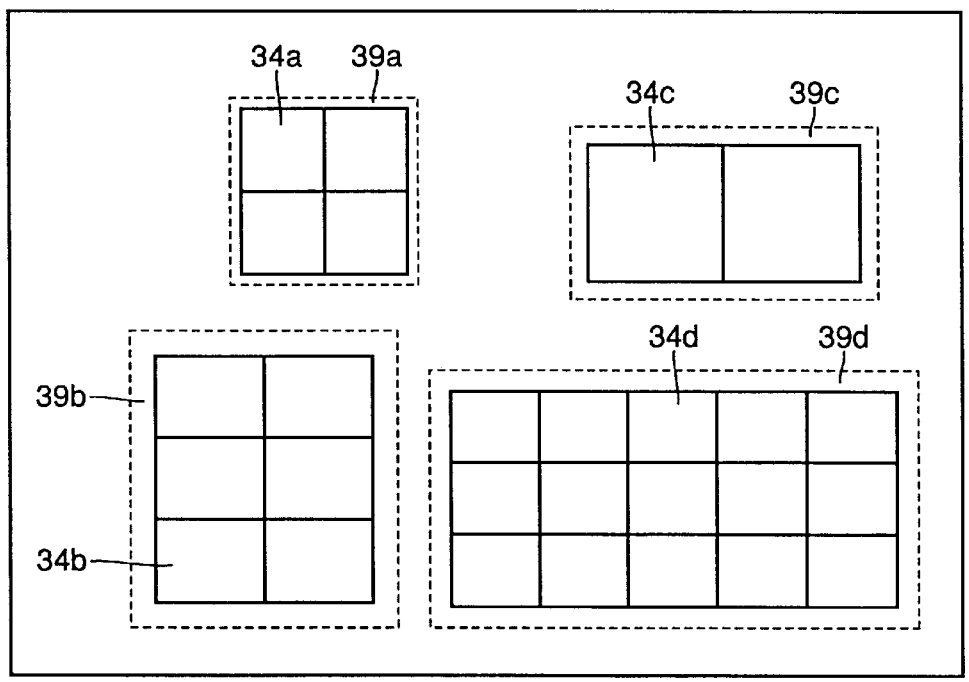
FIG. 6 is a plan view showing an example of a block that is to be processed in the first embodiment.

At S20, mesh clock lines are prepared on a block-by-block basis according to a method similar to that of a conventional one. The size of the cell of the mesh is arbitrary. However, a clock line that surely surrounds the outermost perimeter of the block must be prepared in the apparatus of the first embodiment. FIG. 6 shows each of blocks 39a–39d repared at this step. Blocks 39a–39d include clock lines 34a–34d, respectively. It is to be noted that each of clock lines 34a–34d includes the clock line that surrounds the outermost perimeter of each block.

At S22, hierarchical layout is carried out. The element that is directly related to a clock line is a flip-flop (FF). Therefore, the arrangement and routing of the FF are effected for the clock line, and the clock input terminal of the FF is connected to clock lines 34a–34d. The entire arrangement and routing of all the blocks are carried out within the range surrounded by the clock line at the outermost perimeter of respective blocks.

When all the hierarchical layout is completed, layout at the LSI level is carried out at S24. Here, the layout is arranged on a hierarchy-by-hierarchy basis, and a clock buffer and predriver are configured from the clock input by a method similar to that of the conventional one.

Figure 7:
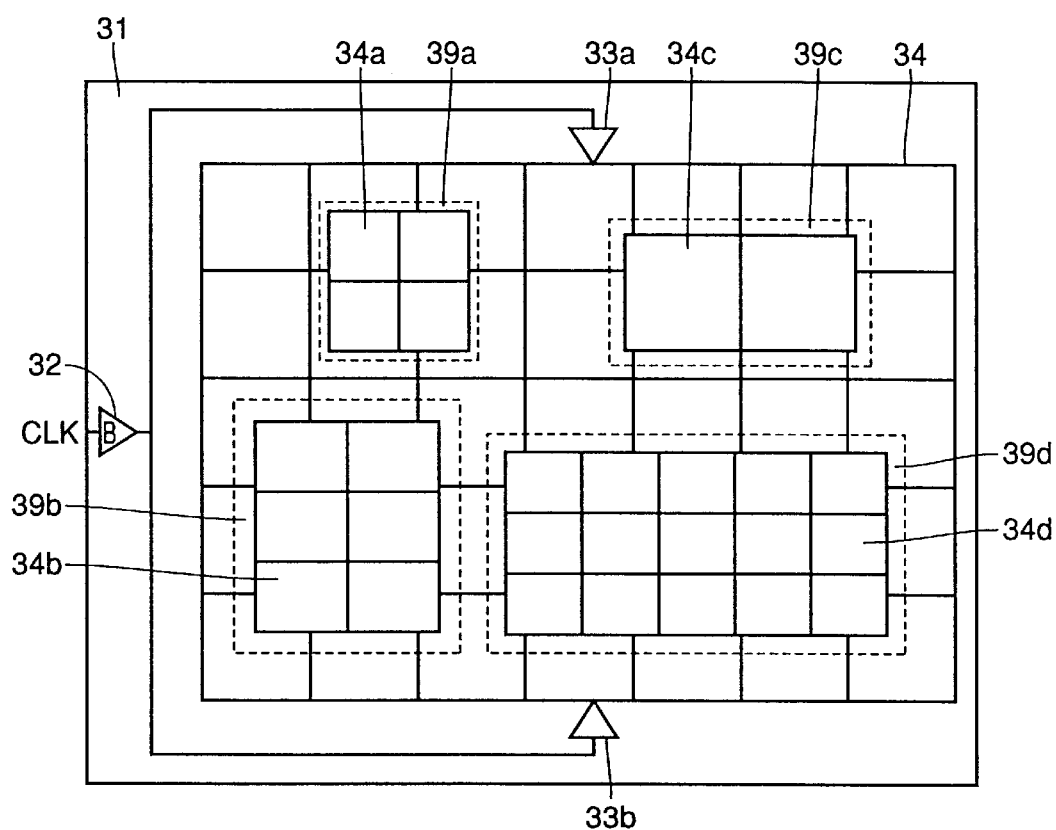
FIG. 7 is a plan view showing an example of LSI layout according to the apparatus of the first embodiment.

At S26, mesh lines are arranged at the LSI level. The wiring method thereat is characteristic in the first embodiment. When the generated clock line crosses the clock line of the outermost perimeter of each hierarchy arranged in advance from the exterior of that hierarchy, generation of a clock line is ceased at that cross point. Then, generation of a clock line is resumed from the same position at the opposite side of the relevant hierarchy. Thus, generation of a clock line at the LSI level is suppressed within the hierarchy. Also, at the crossing point between the clock line of the LSI level and the clock line of the outermost perimeter within each hierarchy, respective corresponding signals are short-circuited. By configuring the clock of the LSI level as described above, the configuration of an LSI 31 shown in FIG. 7 is obtained.

The driving capability of the cross point driver present within the LSI level or within each hierarchy is optimized with respect to the clock circuit configured as described above (S28). The method thereof may be a conventional one.

According to the present method, the clock lines of the entire LSI 31 are configured by clock line 34 of the LSI level and clock lines 34a–34d of each hierarchy. From the standpoint of clock configuration, it is similar to that where all the arrangement and routing are carried out at the LSI level as in the conventional case. However, it is to be noted that hierarchical layout is allowed that was difficult in the conventional method. Thus, skew control of a superior level similar to that of the case where all layout designing is carried out at the LSI level as in the conventional case can be realized with the hierarchical layout in the method of the present invention.

Hierarchical layout is allowed since clock lines 34a–34d are configured on a hierarchy-by-hierarchy basis. Clock line 34 of the LSI level is terminated at the outermost perimeter of the block of each hierarchy. Therefore, the clock lines at the LSI level will not affect the hierarchical layout.

When the arrangement has to be shifted on a hierarchy-by-hierarchy basis, arrangement and routing of each block can be implemented again at an appropriate position without limitation posed on the arrangement on a hierarchy-by-hierarchy basis since clock line 34 of the LSI level only extends up to the outermost perimeter of clock lines 34a–34d of each hierarchy and is indifferent to the layout in the hierarchy.

Thus, the first embodiment provides the advantage that skew control similar to that of global layout can be implemented while carrying out hierarchical layout.

Figure 8:
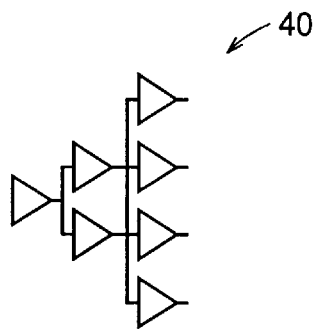
FIG. 8 is a schematic diagram showing an example of a tree predriver.
Figure 9:
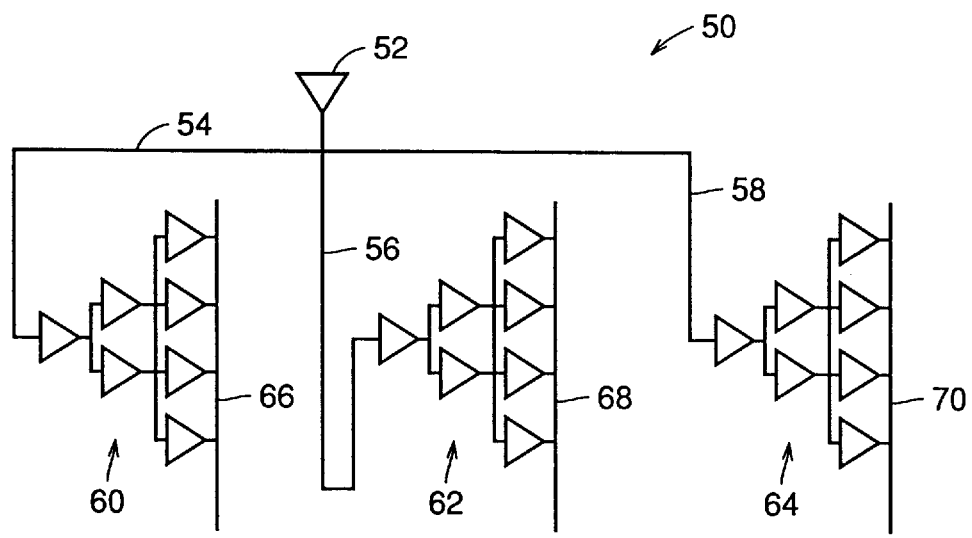
FIG. 9 is a schematic diagram showing an arrangement of a predriver by lines of equal length.

As the LSI predriver generated at S24, the tree-like predriver 40 as shown in FIG. 8 can be employed. Alternatively, a predriver 50 having tree-like predrivers 60–64 connected to clock buffer 52 by lines 54–58 of equal length as shown in FIG. 9 can be employed. Tree-like predrivers 60–64 are connected to, for example, mesh-like clock lines 66–70, respectively, in each block.

Second Embodiment

Figure 10:
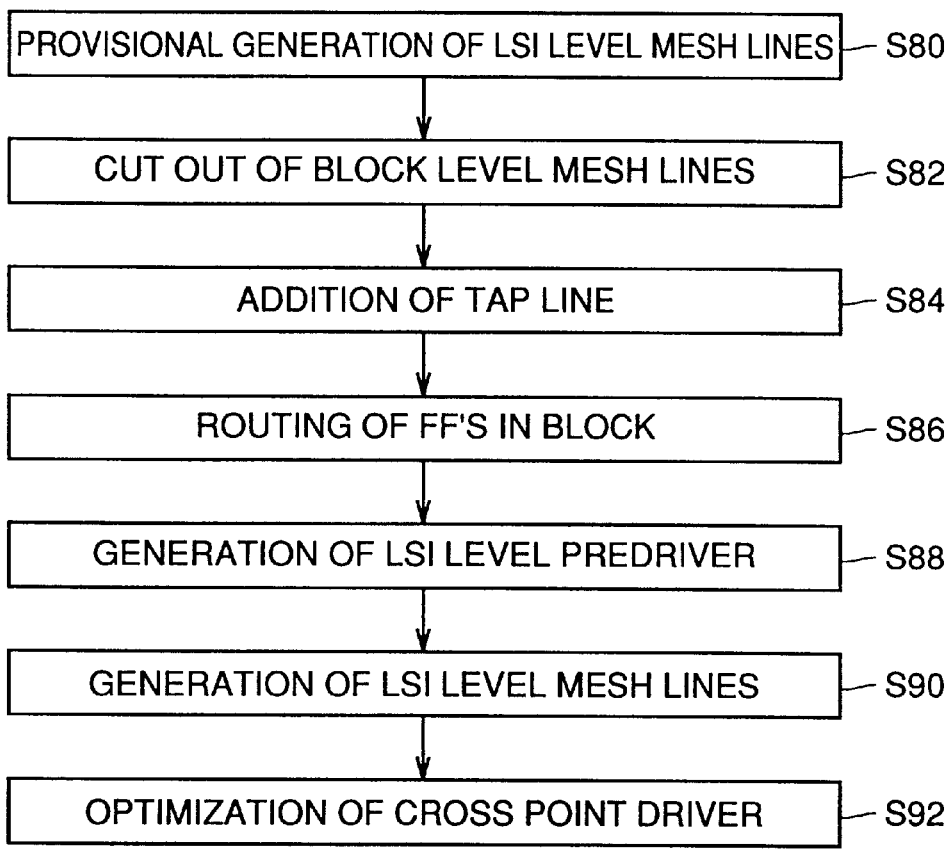
FIG. 10 is a flow chart representing the process flow of an apparatus of a second embodiment of the present invention.

Referring to FIG. 10, a clock configuration method according to a second embodiment of the present invention includes the steps of provisionally generating mesh lines of the LSI level (S80), cutting out mesh lines of the block level (details described afterwards) (S82), adding a tap line (details described afterwards) at the boundary portion between the clock line of the LSI level and the clock line of each block (S84), carrying out block layout (S86), generating a predriver of the LSI level (S88), generating mesh lines of the LSI level (S90), and eventually optimizing the cross point driver (S92).

It is common in hierarchical layout to initiate the layout operation after taking into account the size of each hierarchy at the LSI level and the layout position. At this stage, the process of S80 is carried out.

Figure 11:
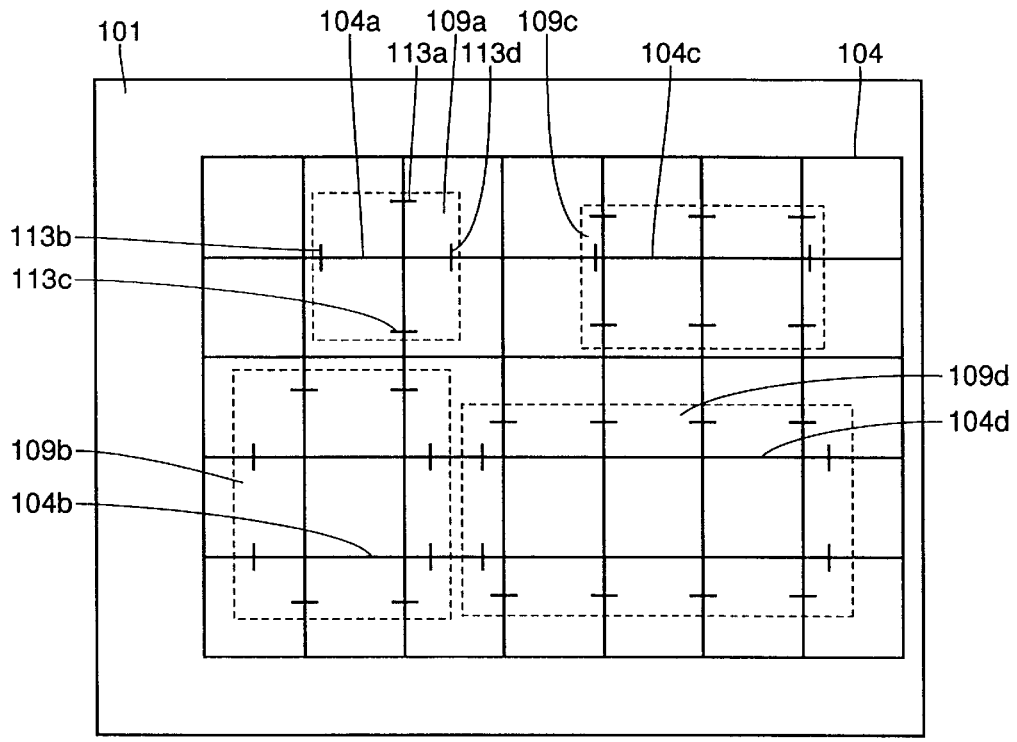
FIG. 11 is a plan view showing an example of LSI layout according to the apparatus of the second embodiment.

At S80, a provisional clock line 104 at the LSI level of LSI 101 is generated on the basis of the layout information of each hierarchy of the stage preceding the initiation of hierarchical layout, as shown in FIG. 11. Provisional clock line 104 of the LSI level can be generated by a method similar to that of a conventional one.

At S82, the portion of provisional clock line 104 at the LSI level that passes through each hierarchy is cut out and removed. At S84, tap lines 113a–113d are provided in a direction crossing provisional clock line 104 at the LSI level (orthogonal in the second embodiment) at the boundary between the remaining portion of provisional clock line 104 at the LSI level and the interior of each block. Then, clock line 104a in the block is connected to each of tap lines 113a–113d. Only the example of left upper block 109a is shown in FIG. 11. The same applies to the remaining blocks 109b–109d.

The following process is similar to that of the first embodiment. At S86, block layout is carried out. In this process, the layout in the block is carried out on the basis of the clock line cut out in each block. Then, the final arrangement of each block at the LSI level is carried out. More specifically, generation of a predriver at the LSI level is carried out (S88). The layout of each block here does not necessarily have to completely match the initially envisaged layout. Since tap lines 113a and the like are present, the connection between provisional clock line 104 of the LSI level and the clock line in each block can be ensured even if each block is moved horizontally or vertically within this range.

The final generation of mesh lines at the LSI level is carried out (S90). Then, optimization of the cross point drivers are carried out according to the arrangement and routing of the overall clock lines (S92).

Figure 12:
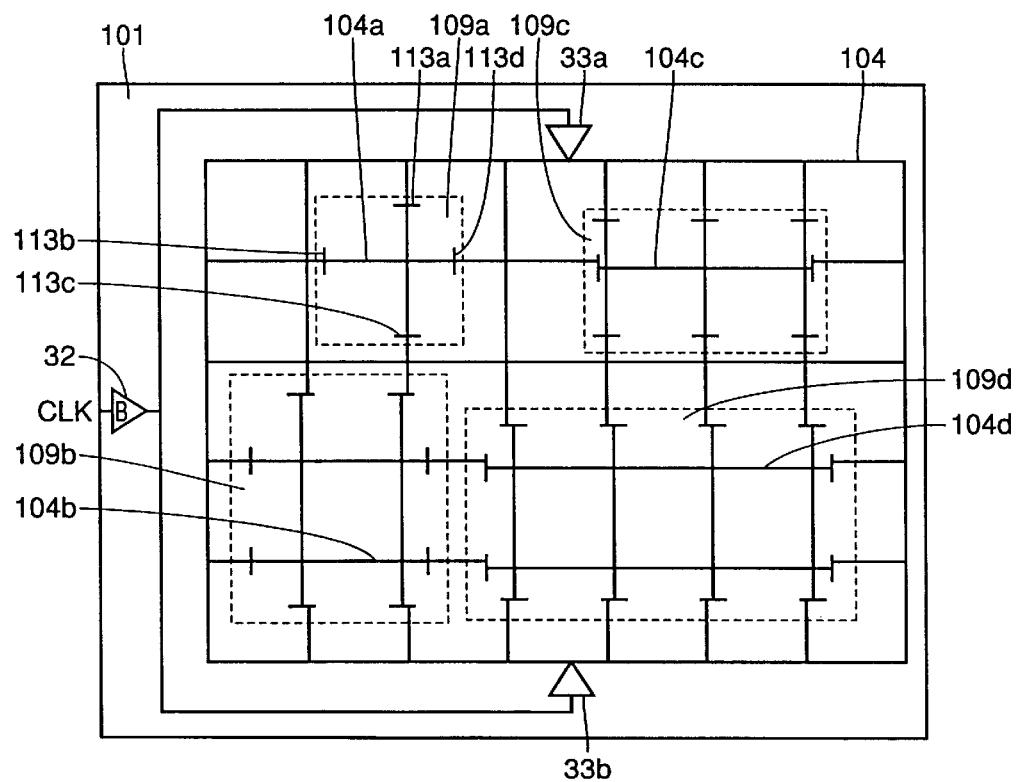
FIG. 12 is a plan view showing an example of final layout of an LSI according to the apparatus of the second embodiment.

FIG. 12 shows the layout of the resultant LSI 101. In FIG. 12, block 109a is located at a position identical to that of the initial position. Block 109b is shifted leftwards. Block 109c is shifted downwards. Block 109d is shifted rightwards and downwards respectively.

According to the second embodiment, the clock line of the LSI level is cut out and used taking into consideration the size and layout of each hierarchy estimated in advance prior to hierarchical layout. Therefore, the outermost clock line that was required in the first embodiment is dispensable. There is an advantage that the total line length of the clock line is reduced to lower power consumption.

The tap line is provided at the boundary of the cut out clock line. Therefore, each block arrangement can be moved within the tap line length. Although the block cannot be arranged at an exact arbitrary position, the block position can be moved within a range smaller than the mesh cell of provisional clock line 104 at the LSI level. In practice, the size and layout position of each hierarchy does not often change significantly prior to and after hierarchical layout. Therefore, block rearrangement is allowed within a practical range by setting an appropriate tap line length. The setting of this tap line length depends upon the design requirement of each LSI and is mainly defined empirically.

Third Embodiment

A tap line 113a and the like are provided in advance in the previous second embodiment. However, there is a method of allowing hierarchical layout without having to use such tap lines. This method will be described in the third embodiment.

Figure 13:
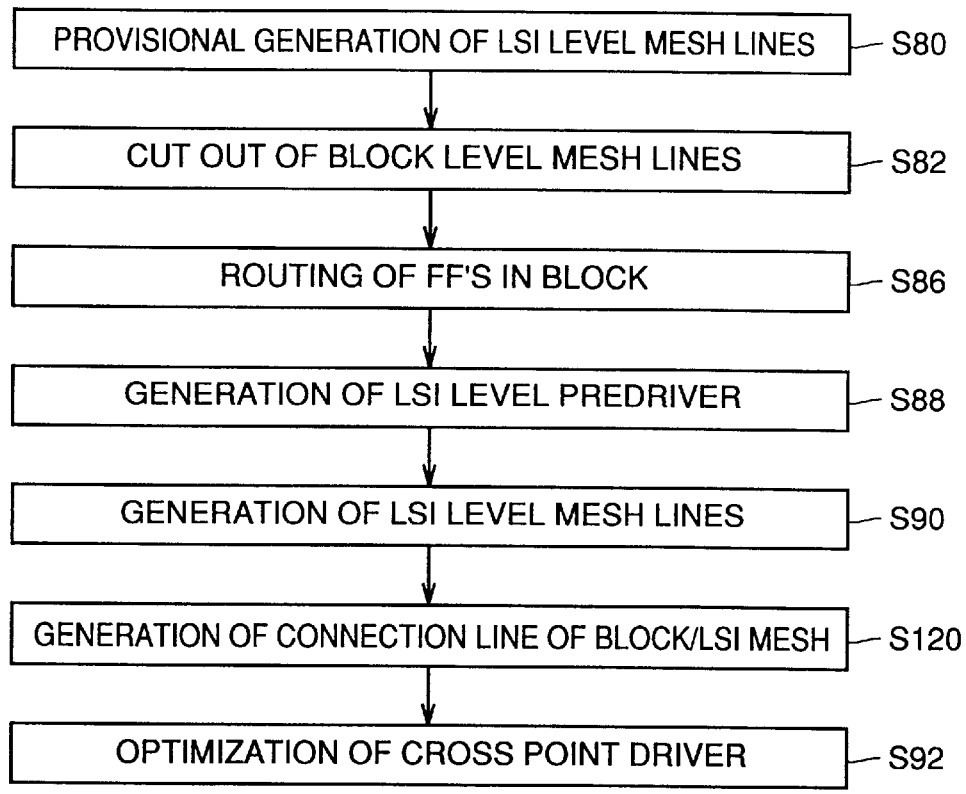
FIG. 13 is a flow chart showing the process flow of an apparatus according to a third embodiment of the present invention.

Referring to FIG. 13, a clock line 134 (FIG. 12) at the LSI level provisionally generated at the boundary of the hierarchy is cut out at the block boundary, and hierarchical layout is carried out in the third embodiment.

The clock line configuration method of the third embodiment differs from the method shown in FIG. 10 in that step S84 is removed, and a new step S120 of generating a connection line of the block/LSI mesh is added between S90 and S92. Only elements differing from those of the second embodiment will be described hereinafter.

At S80 in which clock line 134 of the LSI level is to be generated in advance, generation of clock line 134 of the LSI level at the hierarchy boundary is suppressed.

Figure 14:
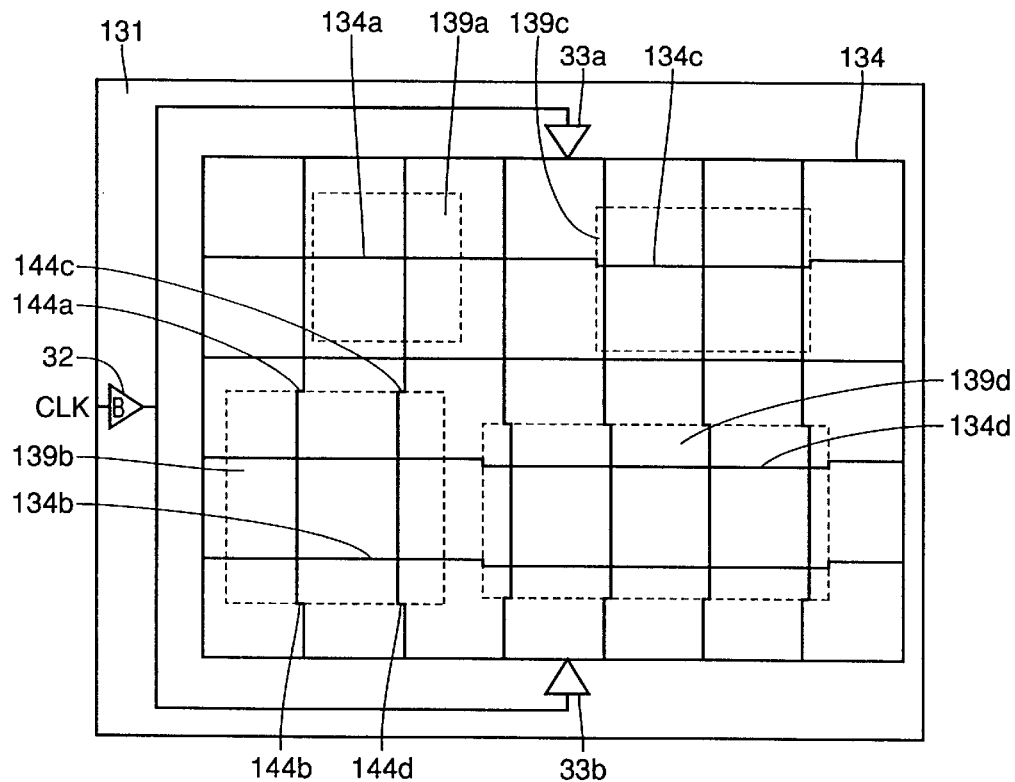
FIG. 14 is a plan view showing an example of LSI layout according to an apparatus of the third embodiment.

At S120, clock lines 134a–134d of each precut hierarchy portion are connected with clock line 134 of the LSI level, as shown in FIG. 14. Here, clock line connection lines 144a–114d that connect those of the shortest distance on the hierarchy boundary with each other are generated. A clock line is configured for each hierarchy in this manner.

In a hierarchy (block 139a in FIG. 14) where the hierarchical layout position does not change between the hierarchy arranged in the provisional generation stage and the actual layout at the LSI level in the third embodiment, unrequired lines such as the tap lines that are always generated in the second embodiment will not be generated. The length of the clock line connection lines generated in other blocks can be suppressed to the minimum. This is advantageous from the standpoint of power consumption. The third embodiment can accommodate the case where the arranged position of the block has moved extremely from the originally estimated position.

Fourth Embodiment

In the previous third embodiment, the clock line cut out from provisionally arranged clock line 134 of the LSI level is used as the clock line of the hierarchy. However, clock lines 34a–34d can be prepared in advance for every hierarchy as in the first embodiment. The present fourth embodiment employs this method.

Figure 15:
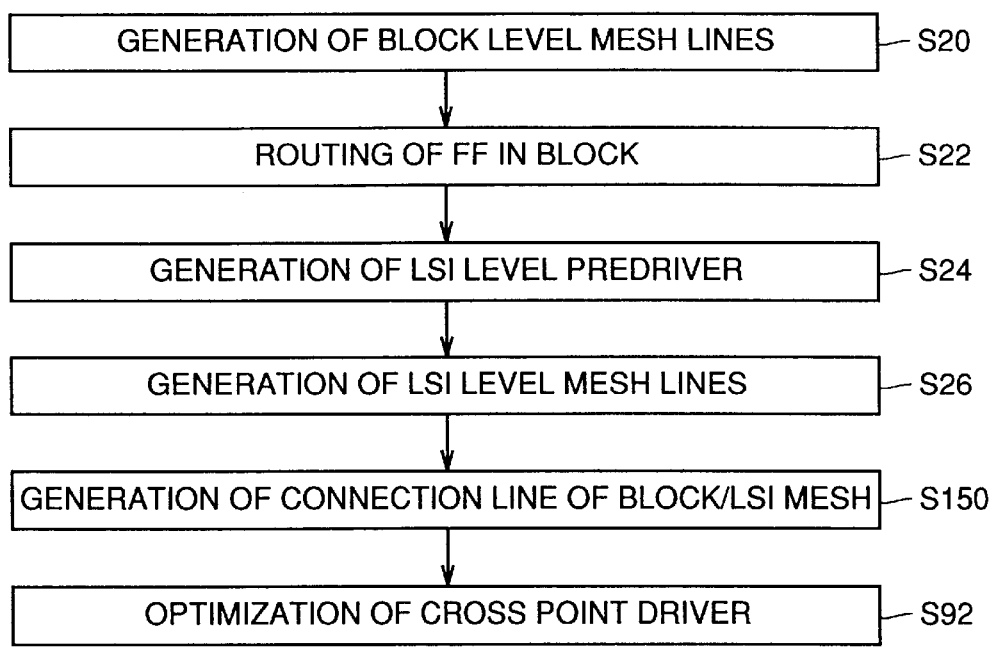
FIG. 15 is a flow chart showing the process flow of an apparatus according to a fourth embodiment of the present invention.

Referring to FIG. 15, the clock configuration method of the fourth embodiment differs from the method of FIG. 5 in that a step S150 of the block/LSI mesh connection line generation process and a step S92 of the cross point driver optimization process are included instead of S28 of FIG. 5. Only those elements differing from those of the first embodiment will be described hereinafter.

Figure 16:
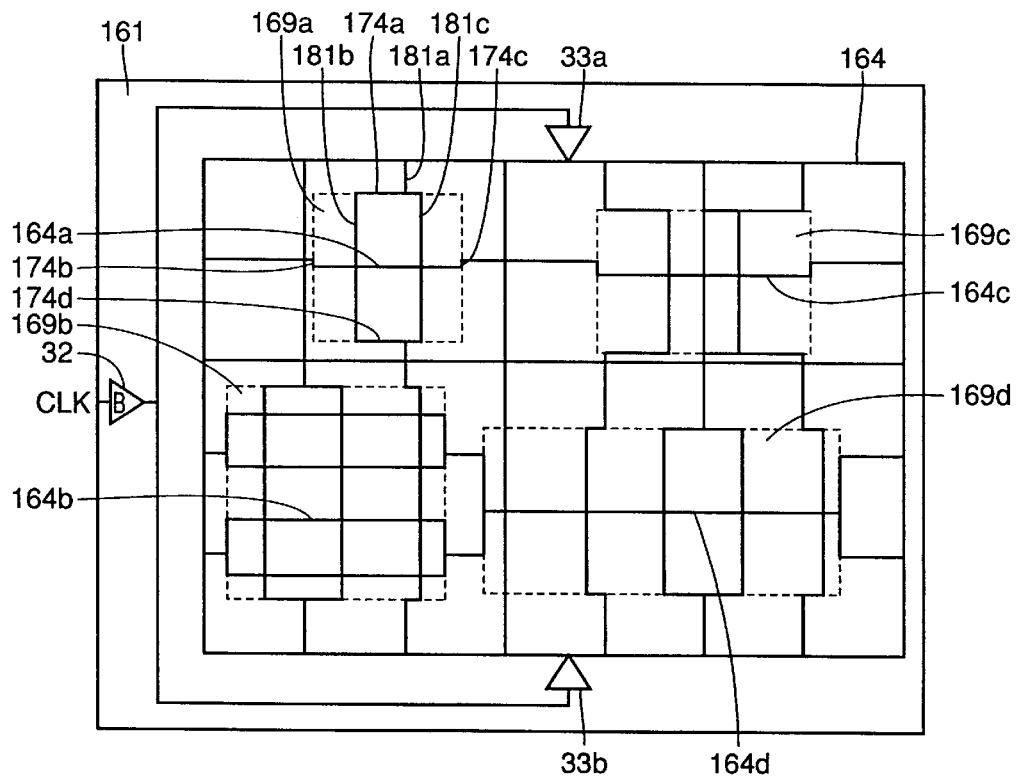
FIG. 16 is a plan view showing an example of LSI layout according to the apparatus of the fourth embodiment of the present invention.

FIG. 16 shows an LSI 161 configured by the fourth embodiment. In this LSI 161, the portion of clock line 164 of the LSI level excluding the portion in the region of each of blocks 169a–169d and clock lines 164a–164d (horizontal direction), clock lines 181b, 181c (vertical direction) in each of blocks 169a–169d are connected by clock line connection lines 174a–174d.

In the fourth embodiment, the number of clock lines 164 at the LSI level does not necessarily have to match the number of the vertical and horizontal clock lines of blocks 169a–169d in each hierarchy. For example, in the connection thereof, there will be no unconnected clock line by generating the connection line of the clock lines so that connection is generated starting from the lines of the block or the LSI level whichever has the greater number of clock lines to the closest clock line of the other.

Referring to FIG. 16, there is only one vertical clock line 181a at the LSI level whereas there are two vertical clock lines 181b and 181c in block 169a. Therefore, connection lines 174a–174d for clock lines are generated starting from the side of the hierarchy (block). More specifically, clock line 181b is connected to clock line 181a by connection line 174a, whereas clock line 181c is connected to clock line 181a by connection line 174c.

The method of the fourth embodiment is applicable to the case where the clock line interval differs between the LSI level and the hierarchy (block) level. This means that an optimum clock line width can be selected for each hierarchy. Also, it is not necessary to carry out arrangement and routing again to match the clock line interval when a hierarchy completed in layout is to be used in another LSI according to the same method. Thus, the method of the fourth embodiment provides the advantage that another LSI design can be used on a layout basis.

Fifth Embodiment

Figure 17:
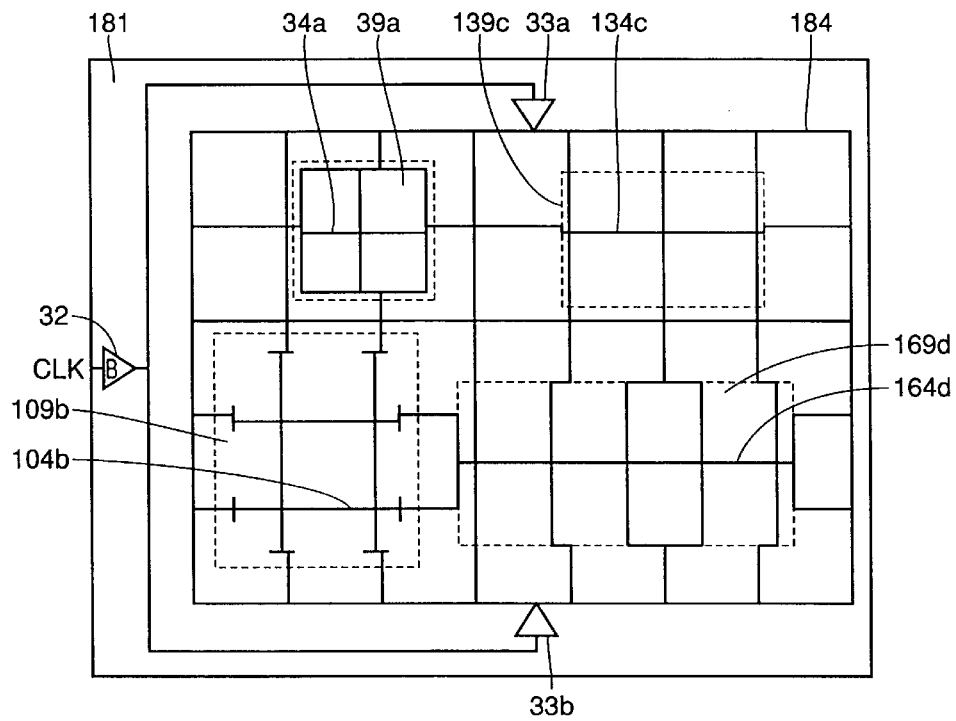
FIG. 17 is a plan view showing an example of LSI layout according to an apparatus of a fifth embodiment of the present invention.

The method of employing only one method for one LSI has been described in the previous first to fourth embodiments. However, the present invention allows the combination of different methods. For example, an example of a clock configuration is shown in FIG. 17 in which all the methods of the first to fourth embodiments are combined. Corresponding elements of FIG. 17 and of the first to fourth embodiments are denoted with same reference characters and detailed description thereof will not be repeated there.

In FIG. 17, the method of the first embodiment is applied to block 39a; the method of the second embodiment is applied to block 109b; the method of the third embodiment is applied to block 139c; and the method of the fourth embodiment is applied to block 169d.

By using a mixture of the above methods, a clock line configuration method optimum for each hierarchy can be employed. Accordingly, a clock line configuration that is most efficient can be implemented as the overall LSI. Also, the reusage range of the layout can be increased since the method does not have to be a particular one when the hierarchical layout of another LSI is used.

Sixth Embodiment

The above first to fifth embodiments relate to a clock line configuration method. The wiring generation method of the present invention is applicable, not only to a clock line, but also to the case where lines must be arranged substantially equal all over the circuit while connecting the LSI level and each hierarchy in the hierarchical layout.

One example is the power supply/ground line known as the wiring that requires performance control at the LSI level. The ground line can be considered as similar to a power supply line in the sense that it applies a constant potential to the circuit. Therefore, the power supply line may be considered to also include the ground line. The power supply/ground line must have a plurality of supply sites of the power supply/ground at the LSI level, and the supply ability of a level that can ensure the operation for all the transistors in the LSI. Therefore, uniform supply capability at the LSI level is required as in the case of the clock signals.

Figure 18:
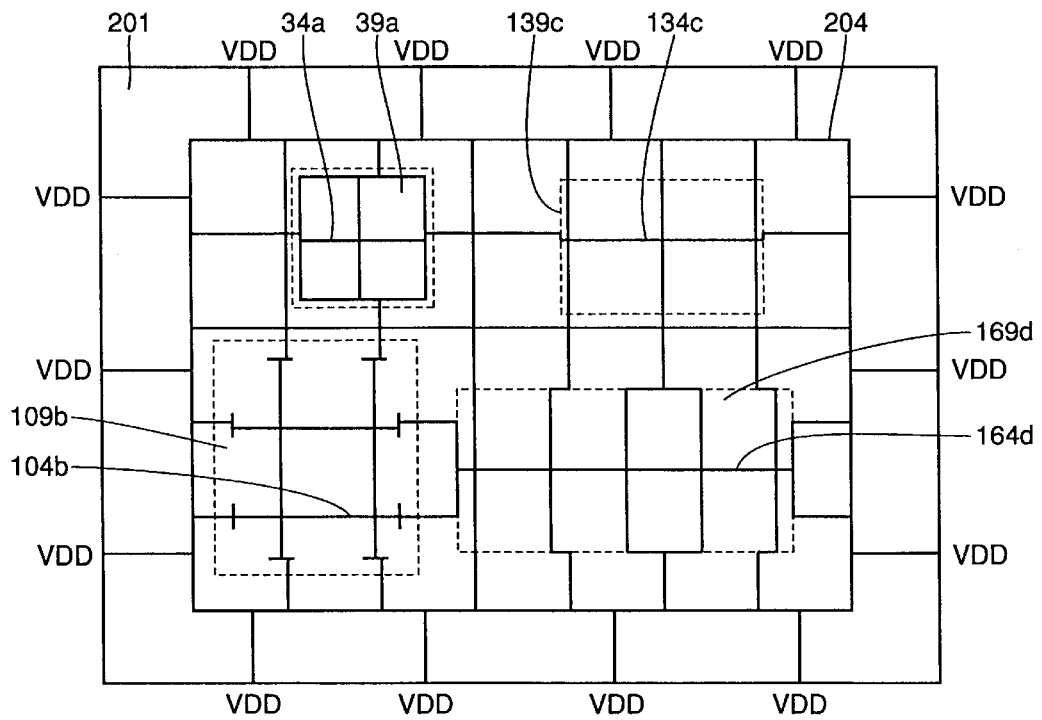
FIG. 18 is a plan view showing an example of LSI layout according to an apparatus of a sixth embodiment of the present invention.

All of the above-described methods can be applied directly to the power supply/ground line. FIG. 18 shows an LSI 201 that has the power supply/ground line arranged applying all the methods described in the first to fourth embodiments. Similar to the fifth embodiment, the example of FIG. 18 has the same reference numbers assigned to corresponding components of the first to fourth embodiments. By configuring the power supply/ground line as described here, stable supply capability can be realized while carrying out hierarchical layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring data generation method generating wiring data in designing a large-scale integrated circuit by hierarchical layout, comprising the steps of:

generating a line in a block of a first level;

carrying out layout of said block of the first level in a block of a second level higher than said first level; and generating mesh lines of said block of the second level within said block of the second level connected to said line in said block of the first level.

2. The wiring data generation method according to claim 1, wherein said step of generating a line in said block of the first level includes the steps of generating a line surrounding an outermost perimeter of said block of the first level, and generating mesh lines of said block of the first level connected to said line surrounding the outermost perimeter within said line surrounding the outermost perimeter of said block of the first level.

3. The wiring data generation method according to claim 2, wherein said step of generating mesh lines of said block of the second level includes the step of forming mesh lines of the second level in a region of said block of the second level outside the region of said block of the first level, and connecting said mesh lines of the second level to said line surrounding the outermost perimeter.

4. The wiring data generation method according to claim 1, further comprising the step of optimizing arrangement of a driver connected to said mesh lines of said block of the second level, for distributing a predetermined signal to said mesh lines.

5. The wiring data generation method according to claim 1, wherein said step of generating a line in said block of the first level includes the step of generating mesh lines of said block of the first level in the block of the first level, wherein said step of generating mesh lines in said block of the second level includes the step of forming mesh lines of said second level at a region of said block of the second level outside the region of said block of the first level, said method further comprising the step of forming a line to connect said mesh lines of said block of the first level to said mesh lines of said block of the second level.

6. The wiring data generation method according to claim 5, wherein said step of forming a line for connection includes the step of forming a line to connect each of said mesh lines of said block of the first level to said mesh lines of said block of the second level closest to each of said mesh lines of said block of the first level.

7. The wiring data generation method according to claim 1, further comprising the step of provisionally generating mesh lines in said block of the second level, wherein said step of generating mesh lines in said block of the second level includes the steps of defining a boundary of a region of said block of the first level for each of said mesh lines in said block of the second level provisionally generated and removing a portion in said block of the first level, and generating a tap line in a direction crossing said mesh lines of said block of the second level at said boundary, and connecting said mesh lines of said block of the first level to said tap line.

8. The wiring data generation method according to claim 7, wherein said direction of crossing is a direction orthogonal to said mesh lines in said block of the second level.

9. The wiring data generation method according to claim 8, further comprising the step of modifying arrangement of said block of the first level by moving said block of the first level along a direction of said tap line.

10. The wiring data generation method according to claim 1, further comprising the step of provisionally generating mesh lines of said block of the second level, wherein said step of generating mesh lines of said block of the second level includes the steps of defining a boundary of a portion in said region of said block of the first level arranged for each of said mesh lines in said block of the second level provisionally generated, and generating a tap line in a direction crossing said mesh lines of said block of the second level at each said boundary, said method further comprising the step of modifying arrangement of said block of the first level allowing movement of each said block of the first level in a range capable of connection of a portion of said mesh lines of the block of said second level in each said block of the first level with said corresponding tap line.

11. The method according to claim 1, wherein the mesh lines of said block of the second level and the line of said block of the first level form lines for propagating a clock signal, and said block of the first level has a logic element connected to the line of said block of the first level.

12. The method according to claim 1, wherein the mesh lines of said block of the second level and the line of said block of the first level form lines for propagating a power supply voltage or a ground voltage externally applied to the large-scale integrated circuit.

13. A wiring data generation apparatus generating wiring data in designing a large-scale integrated circuit by hierarchical layout, comprising:

means for generating a line in a block of a first level;

means for carrying out layout of said block of the first level in a block of a second level higher than said first level; and means for generating mesh lines of said block of the second level in said block of said second level connected to said line in said block of the first level.

14. The wiring data generation apparatus according to claim 13, wherein said means for generating a line in a block of the first level includes means for generating a line surrounding an outermost perimeter of said block of the first level, and means for generating mesh lines of said block of the first level connected to said line surrounding the outermost perimeter in said line surrounding the outermost perimeter of said block of the first level.

15. The wiring data generation apparatus according to claim 14, wherein said means for generating mesh lines in a block of the second level includes means for forming said mesh lines of the second level in a region of said block of the second level outside the region of said block of the first level, and connecting said mesh lines of the second level to said line surrounding the outermost perimeter.

16. The wiring data generation apparatus according to claim 13, further comprising means for optimizing arrangement of a driver connected to said mesh lines of the block of the second level and distributing a predetermined signal to said mesh lines.

17. The wiring data generation apparatus according to claim 13, wherein said means for generating a line in a block of the first level includes means for generating mesh lines of the block of the first level in said block of the first level, wherein said means for generating mesh lines of said block of the second level includes means for forming said mesh lines of the second level at a region of said block of the second level outside the region of said block of the first level, said apparatus further comprising means for forming a line to connect said mesh lines of said block of the first level to said mesh lines of the block of the second level.

18. The wiring data generation apparatus according to claim 17, wherein said means for forming a line for connection includes means for forming a line to connect each of said mesh lines of said block of the first level to said mesh lines of the block of the second level closest to each of said mesh lines of said block of the first level.

19. The wiring data generation apparatus according to claim 13, further comprising:

means for provisionally generating mesh lines of said block of the second level, wherein said means for generating mesh lines of said block of the second level includes means for defining a boundary of a region of said block of the first level arranged for each of said mesh lines of said block of the second level provisionally generated and removing a portion in said block of first level, and generating a tap line in a direction crossing said mesh lines in the block of the second level at said boundary, and means for connecting said mesh lines of said block of the first level to said tap line.

20. The wiring data generation apparatus according to claim 19, wherein said direction of crossing is a direction orthogonal to said mesh lines of the block of the second level.

21. The wiring data generation apparatus according to claim 20, further comprising means for modifying arrangement of said block of the first level by moving said block of the first level along a direction of said tap line.

22. The wiring data generation apparatus according to claim 13, further comprising means for provisionally generating mesh lines of said block of the second level, wherein said means for generating mesh lines of said block of the second level includes means for defining a boundary of a portion in a region of said block of the first level arranged for each of said mesh lines in said block of the second level provisionally generated, and means for generating a tap line in a direction crossing said mesh lines of said block of the second level for each said boundary, said apparatus further comprising means for modifying arrangement of said block of the first level allowing movement of each said block of the first level in a range capable of connection of a portion of said mesh lines of the block of the second level in said block of the first level with said corresponding tap line.

* * * * *